United States Patent
Chen

(10) Patent No.: US 11,196,446 B2
(45) Date of Patent: Dec. 7, 2021

(54) METHOD AND APPARATUS FOR DATA PROCESSING IN A COMMUNICATION SYSTEM

(71) Applicant: Alcatel Lucent, Nozay (FR)

(72) Inventor: Yu Chen, Shanghai (CN)

(73) Assignee: Alcatel Lucent, Nozay (FR)

( * ) Notice: Subject to any disclaimer, the term of this patent is extended or adjusted under 35 U.S.C. 154(b) by 0 days.

(21) Appl. No.: 16/345,390

(22) PCT Filed: Oct. 26, 2017

(86) PCT No.: PCT/IB2017/001539
§ 371 (c)(1),
(2) Date: Apr. 26, 2019

(87) PCT Pub. No.: WO2018/078455
PCT Pub. Date: May 3, 2018

(65) Prior Publication Data
US 2019/0273512 A1   Sep. 5, 2019

(30) Foreign Application Priority Data

Oct. 28, 2016 (CN) .......................... 201610970161.2

(51) Int. Cl.
| | |
|---|---|
| *H03M 13/11* | (2006.01) |
| *H03M 13/09* | (2006.01) |
| *H03M 13/13* | (2006.01) |
| *H03M 13/37* | (2006.01) |
| *H04L 1/00* | (2006.01) |

(52) U.S. Cl.
CPC ....... *H03M 13/1108* (2013.01); *H03M 13/09* (2013.01); *H03M 13/13* (2013.01);
(Continued)

(58) Field of Classification Search
None
See application file for complete search history.

(56) References Cited

U.S. PATENT DOCUMENTS

| | | | | |
|---|---|---|---|---|
| 2011/0078531 A1* | 3/2011 | Umeda | ...................... | H04L 1/20 714/751 |
| 2013/0283114 A1* | 10/2013 | Yang | ................... | H03M 13/093 714/752 |

(Continued)

FOREIGN PATENT DOCUMENTS

| | | |
|---|---|---|
| CN | 105337696 A | 2/2016 |
| CN | 105933010 A | 9/2016 |

(Continued)

OTHER PUBLICATIONS

"Afisiadis, A low-complexity improved successive cancellation decoder for polar codes, Nov. 2, 2014, 48th Asilomar conference on Signals, Systems and Computers, pp. 2116-2120" (Year: 2014).*

(Continued)

*Primary Examiner* — April Y Blair
*Assistant Examiner* — Matthew W Wahlin
(74) *Attorney, Agent, or Firm* — Fay Sharpe LLP

(57) ABSTRACT

Embodiments of the present disclosure relate to a method and apparatus for data processing in a communication system. For example, a method comprises pre-processing received data encoded with a polar code; performing a first decoding of the pre-processed data to obtain output bits; in response to decoding failure of the first decoding, bit-flipping a portion of information bits of the output bits to obtain a first additional frozen bit; and performing a second decoding based on the first additional frozen bit and the pre-processed data. Embodiments of the present disclosure further provide a communication device capable of implementing the above method.

13 Claims, 5 Drawing Sheets

(52) U.S. Cl.
CPC ........ *H03M 13/3715* (2013.01); *H04L 1/005* (2013.01); *H04L 1/0061* (2013.01)

(56) References Cited

U.S. PATENT DOCUMENTS

| | | | |
|---|---|---|---|
| 2014/0208183 A1* | 7/2014 | Mahdavifar | H03M 13/27 714/755 |
| 2014/0365842 A1* | 12/2014 | Li | H03M 13/1111 714/752 |

FOREIGN PATENT DOCUMENTS

| | | |
|---|---|---|
| EP | 2 802 080 A1 | 11/2014 |
| KR | 2015-0125744 A | 11/2015 |

OTHER PUBLICATIONS

"Sarkis, Polar codes for data storage applications, International conference on Computing, Networking and Communications, ICNC 2013, San Diego, California, Jan. 28-31, 2013, IEEE, pp. 840-844" (Year: 2013).*

Orion Afisiadis et al., "A Low-Complexity Improved Successive Cancellation Decoder for Polar Codes," 48$^{th}$ Asilomar Conference on Signals, Systems and Computers, IEEE, pp. 2116-2120, XP032769252, 2014.

Gabi Sarkis et al., "Polar Codes for Data Storage Applications," 2013 International Conference on Computing, Networking and Communications, IEEE, pp. 840-844, XP032377009, 2013.

Erdal Arikan, Channel Polarization: A Method for Constructing Capacity-Achieving Codes, IEEE, pp. 1173-1177, 2008.

International Search Report for PCT/IB2017/001539 dated Mar. 15, 2018.

Yuan Dongfeng, et al., LDPC Code Theory and Application,: (1$^{st}$ edition), Sections 6.2 and 6.3, pp. 115-122, Posts & Telecom Press, Apr. 2008.

Erdal Arikan, "Channel Polarization: A Method for Constructing Capacity-Achieving Codes for Symmetric Binary-Input Memoryless Channels," IEEE Transactions on Information Theory, vol. 55, No. 7, Jul. 2009, pp. 3051-3073.

Kai Niu, et al., "CRC-Aided Decoding of Polar Codes," IEEE Communications Letters, vol. 16, No. 10, Oct. 2012, pp. 1668-1671.

* cited by examiner

METHOD AND APPARATUS FOR DATA PROCESSING IN A COMMUNICATION SYSTEM

TECHNOLOGY

Embodiments of the present disclosure generally relate to a communication system, and more specifically, to a method, apparatus and a computer program product for data processing at a receiver of the communication system.

BACKGROUND

In a paper entitled "Channel Polarization: a Method for Constructing Capacity Achieving Codes for Symmetric Binary-input Memoryless Channels" by E. Arikan, published on IEEE TRANSACTIONS ON INFORMATION THEORY, Vol. 55, No. 7, pages 3051-3073, the concept of polar code is proposed. Currently, in the third generation partnership project (3GPP), polar code is considered as one of the candidates for channel coding of controlling channels and machine type communication (mMTC) in, for example, the fifth generation (5G) mobile communication system. Compared with other channel encoding schemes, polar code has advantages of low complexity and being capable of approximating the capacity, for example.

A decoding scheme usually used for polar code is a list-based scheme or a scheme based on a cyclic redundancy check (CRC)-aided list. The CRC-aided decoding scheme is introduced, for example, in a paper entitled "CRC-Aided Decoding of Polar Codes" by Kai Niu and Kai Chen, published on IEEE COMMUNICATIONS LETTERS, VOL. 16, No. 10, October 2012.

The list is a representation of decoding path. Namely, for a scheme with a list size L, L branches should be reserved during decoding. Generally, to obtain a satisfying performance, a large list size, for example L=32, is required. However, the complexity of the polar code may be modelled as a function of L, namely, $L*\log 2N$, where N is the size of the unpunctured encoded codeword, and L is the list size. As may be known from the complexity modelling, the complexity of the polar code increases proportionally with the list size. Besides, the size of the storage space consumed during the decoding process is also determined by the list size. Therefore, although a large list size can provide good decoding performance, such as low block error rate (BLER), it also consumes more storage space and increases the decoding complexity at the same time, resulting in higher power consumption and longer decoding latency, which is disadvantageous for some receiving devices, particularly an mMTC terminal.

SUMMARY

A brief summary of embodiments is provided below to provide basic understanding of some aspects of the embodiments. It should be noted that this Summary is not intended to identify key features of essential elements or describe a scope of the embodiments, and its sole purpose is to introduce some concepts in a simplified form as a preamble for more detailed description below.

A first aspect of the present disclosure provides a method for data processing in a communication system, the method comprising: pre-processing received data encoded with polar codes; performing a first decoding of the pre-processed data to obtain output bits; in response to decoding failure of the first decoding, bit-flipping a portion of information bits of the output bits to obtain a first additional frozen bit; and performing a second decoding based on the first additional frozen bit and the pre-processed data.

In an embodiment, bit-flipping a portion of information bits of the output bits may comprise: estimating reliability of a encoding sub-channel corresponding to an information bit of the output bits; based on the estimated reliability of the encoding sub-channel, determining a first set of information bits to be flipped; and bit-flipping the first set of information bits.

In another embodiment, determining a first set of information bits to be flipped may comprise: determining information bits corresponding to the encoding sub-channels with the lowest reliability as the first set of information bits.

In another embodiment, determining a first set of information bits to be flipped may comprise: based on the estimated reliability of the encoding sub-channel, determining a set of information bits to be flipped; selecting, from the determined set of information bits, the first set of information bits. In a further embodiment, the method may comprise in response to decoding failure of the second decoding, selecting from the set of information bits a second set of information bits different from the first set of information bits; bit-flipping the second set of information bits to obtain a second additional frozen bit; and performing a third decoding based on the second additional frozen bit and the pre-processed data.

In another embodiment, the method may further comprise performing cyclic redundancy check CRC of output information bits obtained through the second decoding to verify correctness of the second decoding. In some embodiments, performing CRC of the output information bits obtained through the second decoding may comprise at least one of the following: directly using information bits obtained through the second decoding as the output information bits, and performing CRC of the output information bits; and flipping bit-flipped bits of the information bits obtained through the second decoding again to obtain the output information bits, and performing CRC of the output information bits.

In an embodiment, the method may further comprise: estimating reception quality of the received data, and wherein bit-flipping a portion of information bits of the output bits may comprise: if the reception quality is higher than a threshold and the first decoding fails, bit-flipping a portion of information bits of the output bits. In some embodiments, the reception quality may comprise at least one of the following: signal-to-noise ratio (SNR), signal to interference plus noise ratio (SINR), block error rate (BLER), and bit error rate (BER). In another embodiment, the method may further comprise: based on the estimated reception quality of the data, determining parameters for the second decoding.

In some embodiments, the first decoding may employ a list-based polar code decoding algorithm, and wherein bit-flipping the portion of information bits of the output bits may comprise: if the size of the list employed in the first decoding reaches a threshold and the first decoding fails, bit-flipping a portion of information bits of the output bits.

In another embodiment, the bit-flipping and the second decoding are performed for a plurality of rounds until the decoding times reach a predetermined threshold or second decoding succeeds, where in each round, the bit-flipping is performed for a different set of bits to obtain different additional frozen bits; and utilizing the different additional frozen bits and the pre-processed data to perform the second decoding. In a further embodiment, the first decoding employs a polar code decoding algorithm based on a first list size, and the method may further comprise: in response to decoding times of second decoding reaching the predetermined threshold and failing of the decoding, performing a fourth decoding of the pre-processed data with a second list size larger than the first list size.

A second aspect of the present disclosure provides an apparatus at a receiver in a communication system, the apparatus comprising: a pre-processing unit configured to pre-process received data encoded with a polar code; a first decoding unit configured to perform a first decoding of the pre-processed data to obtain output bits; a bit-flipping unit configured to bit-flip a portion of information bits of the output bits in response to decoding failure of the first decoding to obtain a first additional frozen bit; and a second decoding unit configured to perform a second decoding based on the first additional frozen bit and the pre-processed data.

A third aspect of the present disclosure provides a communication device, comprising: a processor and a memory storing instructions, which when executed by the processor, causing the communication device to perform actions including: pre-processing received data encoded with a polar code; performing a first decoding of the pre-processed data to obtain output bits; in response to decoding failure of the first decoding, bit-flipping a portion of information bits of the output bits to obtain a first additional frozen bit; and performing a second decoding based on the first additional frozen bit and the pre-processed data.

Through the following descriptions, it will be appreciated that according to embodiments of the present disclosure, a communication device may obtain desired decoding performance with lower complexity or improve decoding performance while keeping the complexity unchanged.

It will be appreciated that the Summary part does not intend to indicate essential or important features of embodiments of the present disclosure or to limit the scope of the present disclosure. Other features of the present disclosure will be more comprehensible with the following depiction.

BRIEF DESCRIPTION OF THE DRAWINGS

Objectives, advantages and other features of the present disclosure will become more apparent from the following disclosure and claims. For illustration purpose only, example embodiments are described hereby in a non-limiting manner with reference to accompanying drawings, in which:

DETAILED DESCRIPTION

In the following description, many details are illustrated for the purpose of illustration. However, those skilled in the art would realize that embodiments of the present disclosure may be implemented without these specific details. Therefore, the present disclosure is not intended to be limited by the embodiments shown but will be endowed with the broadest scope consistent with the principles and features described herein.

It should be appreciated that terms "a first", "a second", etc. are only used to distinguish one element from another. As a matter of fact, a first element can also be called a second element and vice versa. It should also be appreciated that "comprise", "comprising", "include" and "including" are only used to indicate presence of the illustrated features, elements, functions or components without excluding presence of one or more other features, elements, functions or components.

For ease of explanation, some embodiments of the present disclosure will be illustrated in the context of wireless communication, such as cellular communication and using terms in long-term evolution/long-term evolution-advanced (LTE/LTE-A) or 5G developed by 3GPP. However, as may be appreciated by those skilled in the art, embodiments of the present disclosure are by no means limited to the wireless communication systems following wireless communication protocols specified by 3GPP, but could be applied in any communication system with similar problems, such as WLAN, a wired communication system, or other communication systems to be developed in the future.

Similarly, the "terminal device" described herein may be user equipment (UE) or any terminal capable of wired or wireless communication, including but not limited to, a cellphone, a computer, a personal digital assistant, a game console, a wearable device, a vehicle-mounted communication device, a machine type communication (MTC) device, a device-to-device (D2D) communication device, a sensor and so on. The term "terminal device" may be used interchangeably with UE, a mobile station, a subscriber station, a mobile terminal, a user terminal or a wireless device. Besides, a network device may be a network node, such as a node B (Node B or NB), a basic transceiver station (BTS), a base station (BS), or a base station sub-system (BSS), a relay, a remote radio head (RRH), an access node (AN), an access point (AP) and so on.

Figure 1A:
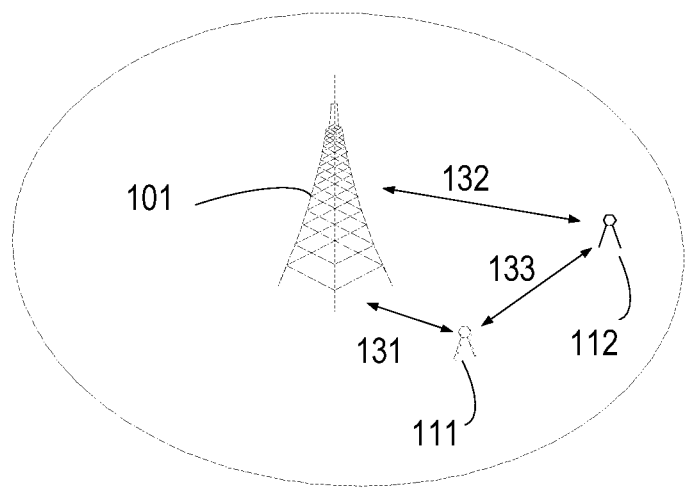
FIG. 1 is a schematic diagram illustrating an example wireless communication system in which a method according to an embodiment of the present disclosure may be implemented.

FIG. 1A shows a schematic diagram of an example wireless communication system 100 in which a method according to an embodiment of the present disclosure may be implemented. A wireless communication system 100 may comprise one or more network devices 101. For instance, in this example, the network device 101 may be embodied by a base station, such as an evolved node B (eNodeB or eNB). It shall be appreciated that the network device 101 can also be embodied in other forms, such as a node B, a basic transceiver station (BTS), a base station (BS), or a base station sub-system (BSS), a relay and so on. The network device 101 provides wireless connections for a plurality of terminal devices 111-112 within its coverage. Terminal devices 111 and 112 may communicate with the network device via a wireless transmission channel 131 or 132 and/or communicate with each other via a transmission channel 133.

Figure 1B:
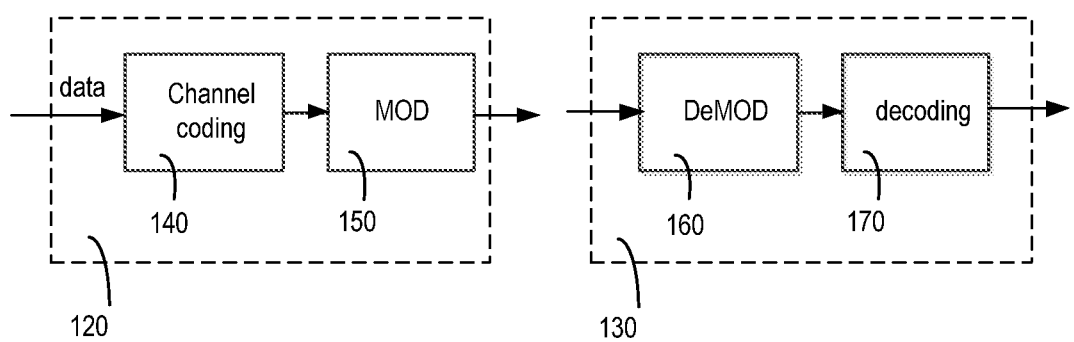

FIG. 1B illustrates a simplified schematic diagram of processing implemented at a transmitting terminal 120 and a receiving terminal 130 of communication, where the transmitting terminal and/or receiving terminal may be, for example, the network device 101 or terminal devices 111 and 112 shown in FIG. 1A. As shown in FIG. 1B, to ensure reliable transmission of data (comprising control signaling), the transmitting terminal performs channel encoding (140) of data to be transmitted, to introduce redundancy, in order to cope with distortion that might be introduced in the transmission channel (such as 131, 132 and 133 shown in FIG. 1A). Optionally, channel encoded data may be further channel interleaved (not shown) and/or modulated (150) prior to transmission. At the receiving terminal, a reverse process of that at the transmitting terminal is performed, namely, the received signals are demodulated (160), de-interleaved (not shown) and decoded (170) to restore the transmitted data. In some embodiments, other or different processing may be performed at the transmitting terminal, and the receiving terminal may implement a reverse operation correspondingly.

In an embodiment of the present disclosure, a polar code is utilized in channel encoding processing 140 shown in FIG. 1B. For a polar code with a code length of N (such as $N=2^n$), assuming a code rate of K/N, then there are K=[1, N] information bits that may be transmitted. Other N–K bits apart from the K information bits are redundancy bits which are configured to be fixed values (for example, 0 or any other proper value) and called frozen bits. The values of the frozen bits are considered known and thus, are configured to be the known values or a probability representation corresponding to the known values (for instance, a particular value of log-likelihood ratio).

The polar code implements channel polarization via two steps, channel combining and channel splitting. It should be noted that the channel mentioned here refers to an encoding channel, namely, a channel that an encoding bit passes through during an encoding process from inputting to outputting, rather than a transmission channel 131-133 in FIG. 1A. The channel experienced by each encoding bit may also be referred to as a sub-channel. It is found that different split sub-channels have different channel transfer probabilities. When the code length N is large, the channel transfer probability approaches 0 or 1, thereby obtaining a result for channel polarization. The channel transfer probability may be calculated as follows:

$$W_N^{(i)}(y_1^N, u_1^{i-1} | u_i) = \sum_{u_{i+1}^N \in X^{N-1}} \frac{1}{2^{N-1}} W_N(y_1^N | u_1^N) \quad (1)$$

The equation and the process of channel polarization are recited in the article written by E. Arikan mentioned above. In the above equation, i represents the $i^{th}$ sub-channel, u represents an input bit, y represents an output bit, N represents the code length, X is a set of input information and W represents probability. The basic concept represented by this equation is that the probability of the $i^{th}$ sub-channel to be decoded depends on channel output $y_1^N$ and the decoded $1^{st}$ to $(i-1)^{th}$ bit $u_1^{j-1}$, which also represents the basic idea of classical sequential decoding. Besides, as shown by the right side of the above equation (1), due to the effect of channel polarization, it is actually equivalent to obtaining each encoding output bit by transmitting it in a synthesized channel.

Due to the above channel transfer characteristic, for a polar code, if there is an error in some bit being decoded previously, then the error will affect decoding of the following bits, thus causing error propagation.

Any modulation technology known or to be developed in the future, such as BPSK, QPSK and 64QAM and the like, may be utilized at modulation processing 150 shown in FIG. 1B. Embodiments of the present disclosure are not limited to any particular modulation scheme. It shall be understood that in modulation 160 of the receiving terminal 130, a corresponding demodulation scheme will be adopted depending on the modulation scheme. As may be understood by those skilled in the art, depending on different processing adopted at the transmitting terminal, the receiver may adopt other processing than modulation alternatively or additionally.

In an embodiment of the present disclosure, the decoding 170 shown in FIG. 1B may adopt, for instance but without limitation, a list-based decoding method, or a method based on successive cancellation (SC), or any decoding method currently known or to be developed in the future. For example, a decoding method introduced in sections. 6.2 and 6.3 of the book entitled "LDPC Code Theory and Aplication" ($1^{st}$ edition) by Yuan Dongfeng and Zhang Haigang published by Posts & Telecom Press in April, 2008 may be utilized.

To reduce complexity and/or power and storage resource consumption of decoding, embodiments of the present disclosure provide a method and apparatus for improving decoding.

Figure 2A:
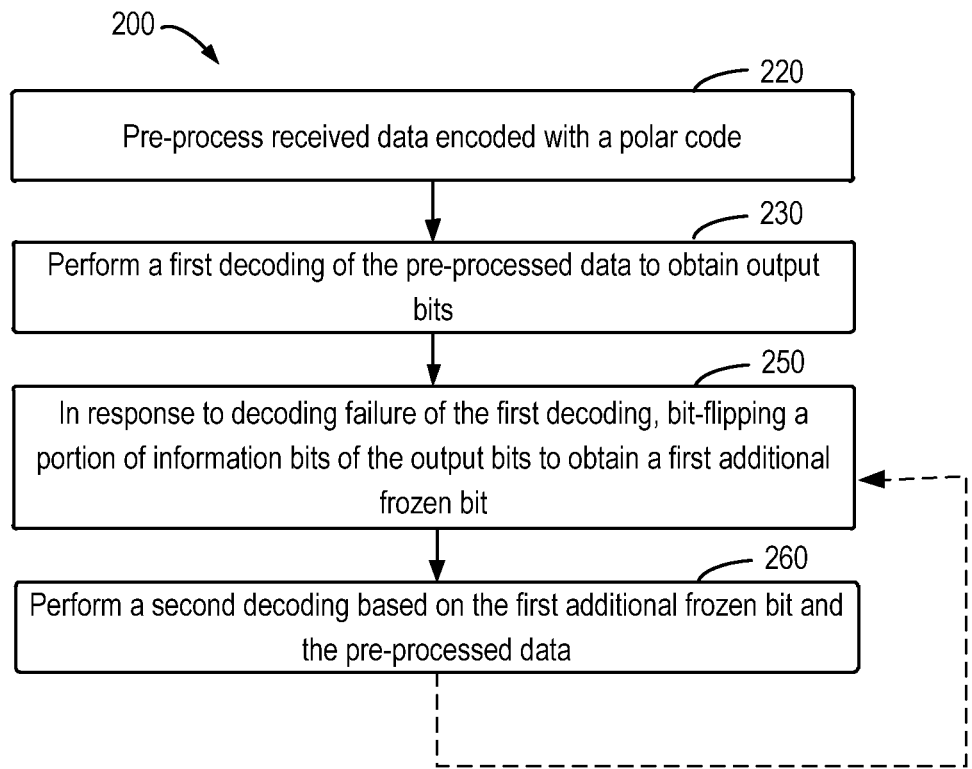
FIGS. 2A-2D show flow charts of a method implemented at a receiving device of a wireless communication network according to embodiments of the present disclosure.

Now, an example method according to an embodiment of the present disclosure is introduced by referring to FIG. 2A. FIG. 2A illustrates a flow chart of a method 200 according to an embodiment of the present disclosure. The method 200 is implemented at a communication device such as a receiving device in a communication network (for example wireless network 100 shown in FIG. 1). For example, the communication device is the terminal device UE 111, 112 or the network device 101 in FIG. 1. For ease of depiction, method 200 will be described below with reference to UE 111 in FIG. 1.

As shown in FIG. 2A, at block 220, UE 111 pre-processes the received data encoded with a polar code. In an embodiment, in addition to encoding, the received data may also undergo other processing(s), such as modulation 150 shown in FIG. 1B and channel interleaving not shown and so on, prior to transmission. The modulation may be performed in any proper manner, for instance but without limitation, modulation based on amplitude and/or phase. Depending on processing(s) of the data experienced at the transmitting side, at block 220, UE 111 performs corresponding pre-processing(s) of the data, such as demodulation. In an embodiment, this may correspond to an operation in demodulation 160 shown in FIG. 1B. Besides, depending on different processing manners being utilized, the pre-processed data may comprise, for example, hard decision or soft decision information, such as LLR, of encoded information bits and inherent frozen bits. Embodiments of the present disclosure are not limited to any specific form of the pre-processed data.

At block 230, UE 111 performs decoding of the pre-processed data, which is called a first decoding for differentiation with subsequent decoding(s). Decoding output bits are obtained through the first decoding. Due to distortion introduced by passing through a transmission channel, the decoding might fail.

As shown in FIG. 2A, if the first decoding fails, UE 111 will further execute blocks 250 and 260. At block 250, UE 111 bit-flips a portion of information bits of the decoding output bits. The bit-flipping means that: if the original bit is 0, then configuring it as 1; and vice versa, if the original bit is 1, then configuring it as 0. In an embodiment, the flipping may be implemented by, for example (but without limitation), performing an XOR operation of a bit and 1. In an embodiment, the flipped portion of information bits may be one bit while in another embodiment, it may be a combination of a plurality of bits. Compared with flipping of a single bit, calculation of a combination of a plurality of bits has higher complexity. The flipped portion of information bits is called a first additional frozen bit(s). "Additional" mentioned here means that the first frozen bit is a frozen bit obtained additionally through bit-flipping in addition to the inherent frozen bits introduced during encoding of a polar code. Besides, it should be noted that the first additional frozen bit may be one or more bits. Similar to the conventional frozen bits, the first additional frozen bit is considered as a known value in decoding.

Figure 2B:
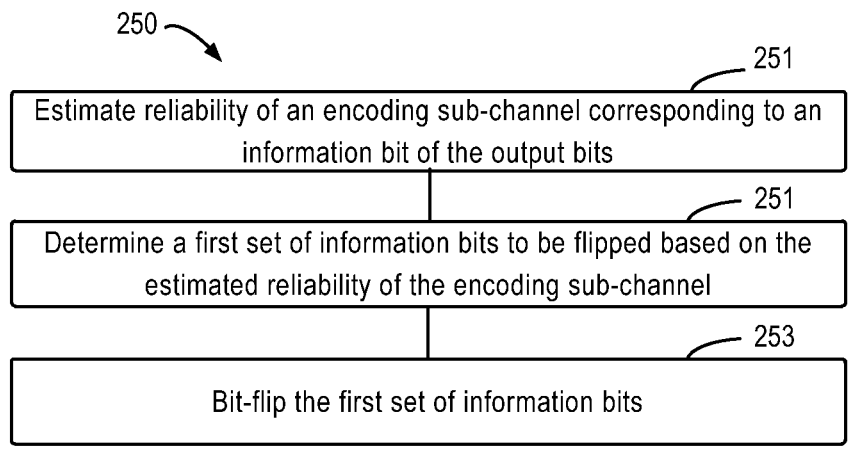

FIG. 2B illustrates an example embodiment of the bit-flipping shown in block 250. As shown in FIG. 2B, in this example, UE 111 may implement the bit-flipping through operations of sub-blocks 251-253. Specifically, in block 251, UE 111 estimates reliability of an encoding sub-channel corresponding to an information bit of the output bits. At block 252, UE 111 determines a first set of information bits to be flipped based on the estimated reliability of the encoding sub-channel. Error probability of an information bit is high if the encoding sub-channel is unreliable. Therefore, in an embodiment, UE may determine one or more information bits corresponding to encoding sub-channels with the lowest reliability as the first set of information bits. In another embodiment, UE can firstly determine a larger set of information bits (such as a bit set corresponding to a sub-channel set S0) to be flipped based on reliability of the estimated encoding sub-channel, and select one or more bits from the determined set of information bits as a smaller first set of information bits. At block 253, UE 111 performs bit-flipping of the determined first set of information bits.

As an example rather than limitation, in an embodiment, reliability of an encoding sub-channel may be measured with channel transfer probability. In another embodiment, reliability of a sub-channel may be calculated alternatively or additionally with density evolution. In still another embodiment, Gaussian approximation for the density evolution may be used to estimate reliability of a sub-channel to reduce complexity. As another alternative embodiment, reliability of a sub-channel may be determined with capacity of the sub-channel, where a sub-channel with a higher capacity is considered to have higher reliability. In still another embodiment, a Bhattacharyya parameter for each sub-channel can also be used to evaluate reliability of the corresponding sub-channel. Regarding various estimation methods, reference may be made to the article written by E. Arikan and the book written by Yuan Dongfeng and Zhang Haigang mentioned above. However, as may be appreciated by those skilled in the art, embodiments of the present disclosure are not limited to any specific manner listed above to estimate the reliability of sub-channels.

In some embodiments, a plurality of estimation technologies may be utilized in combination to enhance estimation performance of sub-channels. For instance, when two sub-channels with the same reliability are obtained with a estimation method, another estimation method may be employed to further differentiate their reliability.

Returning to FIG. 2A, at block 260, UE 111 performs a second decoding based on the first additional frozen bit and the pre-processed data. The pre-processed data contain information about information bits and the inherent frozen bits introduced during polar coding. During re-decoding, the first additional frozen bit obtained through the bit-flipping is considered as a known value similar to the inherent frozen bits, and the bit-flipping operation can trigger a new correction operation in the second decoding. Thus, when the previous decoding (namely, the first decoding) fails, the second decoding may obtain a correct decoding result. Therefore, method 200 of the present disclosure may obtain good decoding performance with reduced complexity.

In some embodiments, the bit-flipping in block 250 and the second decoding operation in block 260 shown in FIG. 2 may be performed for a plurality of rounds (as shown by dotted lines in FIG. 2A) until decoding times reach a predetermined threshold or the decoding succeeds. In each round, at block 250, the bit-flipping is performed for different bits (or a combination of bits) and in the second decoding of block 260, different additional frozen bits obtained through different bit-flipping are used for decoding. For example, UE may flip a certain bit initially at block 250, and cancel the previous flipping if the second decoding in block 260 fails, and returns to block 250 to flip another different bit, and at block 260 performs re-decoding using new additional frozen bits obtained through new bit-flipping and the pre-processed data.

Figure 2C:
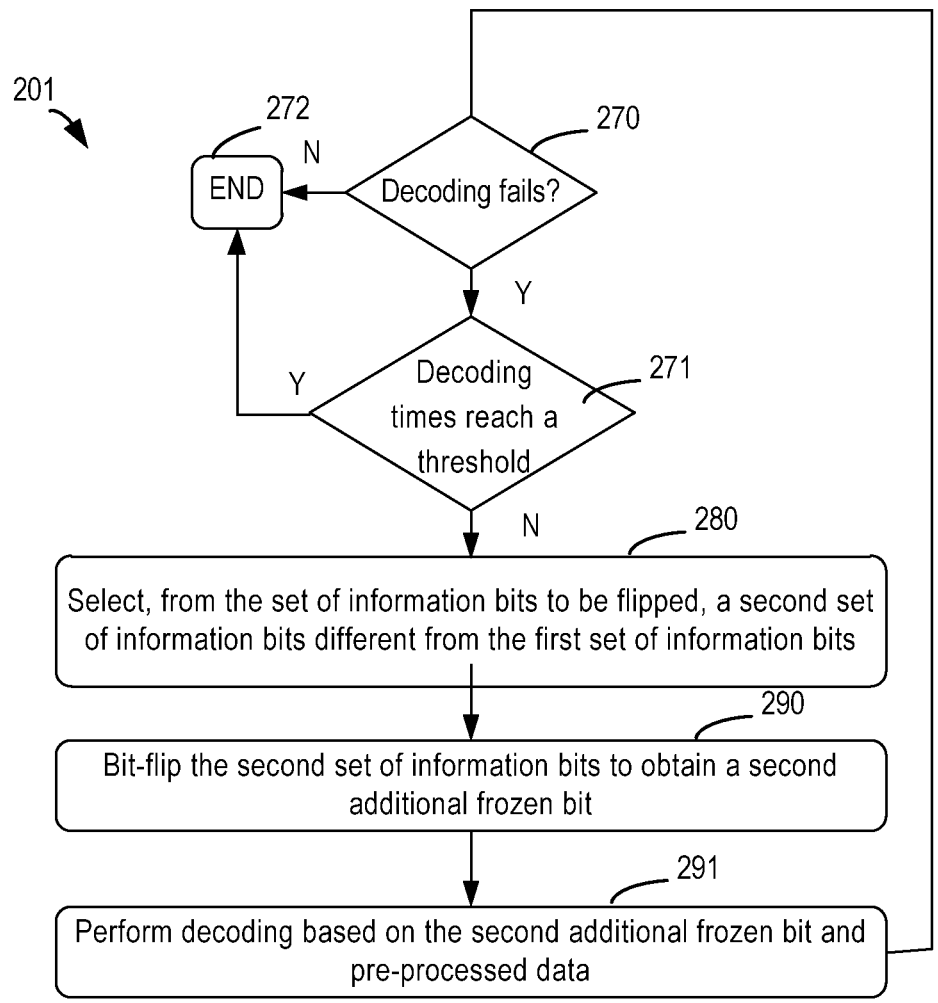

FIG. 2C illustrates an example method 201 for iterative decoding. As shown in FIG. 2C, in an embodiment, at block 270, UE 111 determines whether the second decoding fails. If it determines that the decoding fails, then optionally, it may determine at block 271 whether decoding times reach a threshold. If yes, at block 280, a second set of information bits, that consists of one or more bits and is different from the first set of bits, is selected from, for instance, a set of information bits to be flipped. At block 290, the second set of bits is bit-flipped to obtain a second additional frozen bit. Then, at block 291, UE may perform a third decoding utilizing the second frozen bit and the pre-processed data. As shown in FIG. 2C, operations 270, 280, 290 and 291 may be implemented for a plurality of times until a predetermined threshold is reached or decoding succeeds and stops at block 272. Operations of blocks 290 and 291 may be similar to operations 250, 260 shown in FIG. 2A.

A polar code with K=20 and code length N=32 is taken as an illustrative example below. In this example, there are 32 sub-channels, and 20 sub-channels among which are utilized. Among 20 bits, 16 bits are information bits and 4 bits are cyclic redundancy check (CRC) bits. The receiver may estimate reliability of the 20 sub-channels with density evolution. Assuming that the estimation result indicates that sub-channels with sub-channel number 11, 6, 3, 5 among the 20 sub-channels are the least reliable, then the corresponding information bits with indexes 11, 6, 3, 5 are used as a set of flipping bit candidate. During decoding, a CRC-aided list decoding algorithm with a list size of L=2 may be firstly used for the decoding. If the decoding fails, then the $11^{th}$ bit which is the least reliable one among the 20 bits output from the decoder is flipped and then decoding is performed again. If decoding fails again, the $6^{th}$ bit rather than the $11^{th}$ bit will be flipped and decoding is performed again. In a similar fashion, if decoding still fails, another one or more flipping bits may be selected from the set of flipping bit candidates until decoding succeeds or predetermined times of decoding are reached. In another embodiment, the set of flipping bits being selected partially overlaps with the set selected last time.

After ending of decoding, optionally, CRC may be utilized to verify whether the decoding is correct. For example, this operation may be implemented at block 250 in FIG. 2A and 270 in FIG. 2C. However, embodiments of the present disclosure are not limited to the CRC-based verifying mechanism. For example, in another embodiment, the verification may also be performed based on, for instance, parity check, hash function and the like.

Figure 2D:
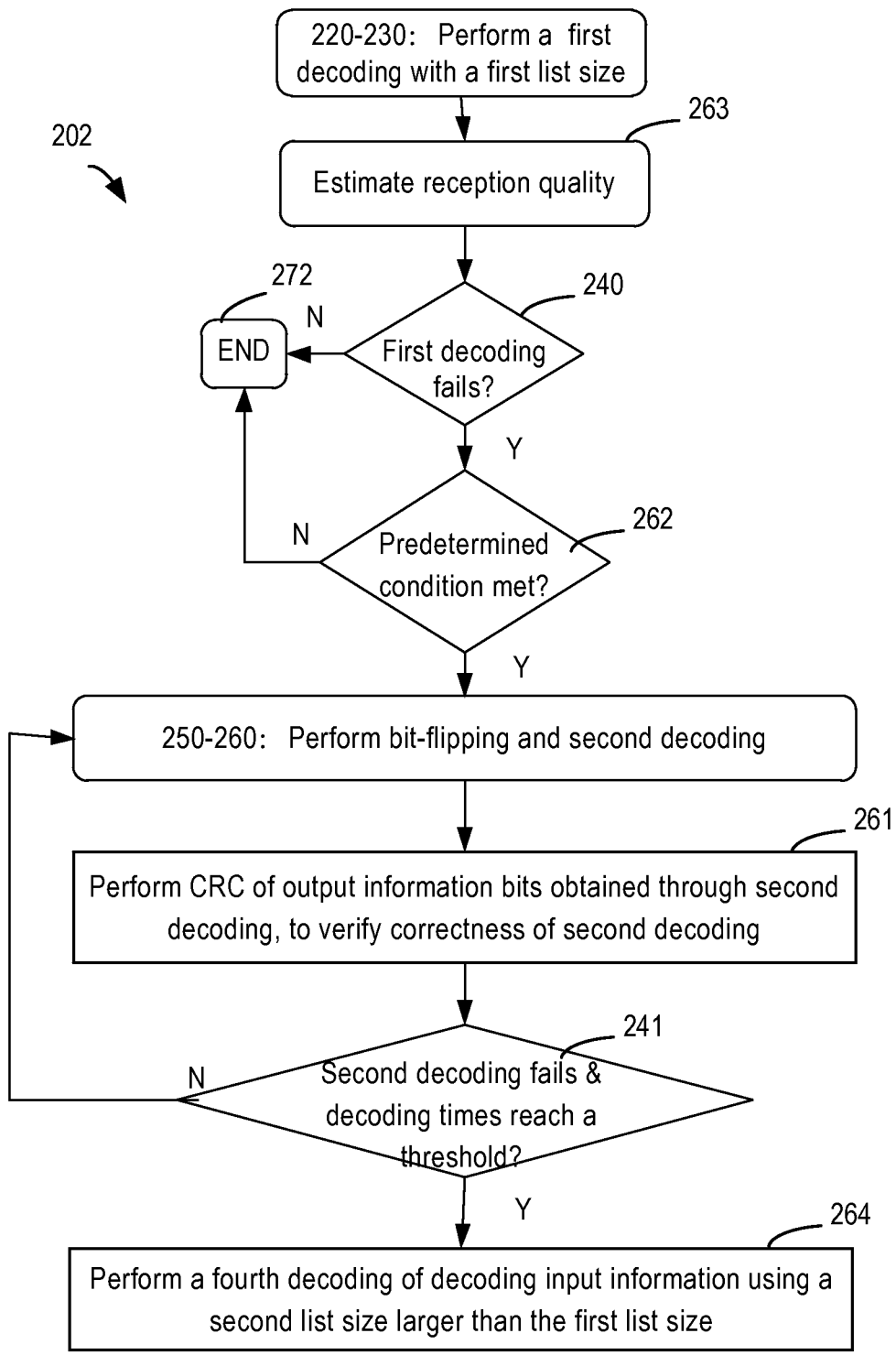

FIG. 2D shows a plurality of example embodiments of method 202. It should be noted that in different embodiments, one or more processing in FIG. 2D may be omitted. In an example, optionally, UE 111 may perform CRC of output information bits obtained through the second decoding at block 261 in FIG. 2D to verify correctness of the second decoding. When bit flipping is employed in decoding, in an embodiment, the flipped bits are used as a portion of output information bits of the decoder, namely, the flipped bits are considered as reliable decoding outputs. In another embodiment, the flipped bits are flipped again and then used as a portion of output information bits of the decoder. In other words, the flipped bits are restored as non-flipped values and then used as a portion of decoding output. In this embodiment, flipped bits are only used to trigger error correction during the decoding process and it is not assumed whether the flipped bits are correct or erroneous. Therefore, non-flipped bits are still used as decoding output. This embodiment can obtain better performance under some conditions.

Hence, in some embodiments, at block 261 in FIG. 2D, UE 111 may directly use information bits obtained through the second decoding as the output information bits, and perform CRC of the output information bits. In another embodiment, UE 111 may flip bit-flipped bits in the information bits obtained through the second decoding again to obtain the output information bits, and perform CRC operation of the output information bits. In still another embodiment, CRC operation may be performed to verify decoding output information bits containing flipped bits and decoding output information bits containing non-flipped bits, respectively. In an embodiment, one of the above CRC verification operations may be performed at block 250 in FIG. 2A and block 270 in FIG. 2C to determine whether decoding is correct. In an embodiment, operations at blocks 210-230 and 250-260 in FIG. 2D may be the same as that described with reference to FIGS. 2A-2B.

In another embodiment, even if previous decoding fails (for example, the first decoding fails), the bit-flipping (250) and the second decoding (260) operations in FIG. 2D are not always implemented. Optionally, the operations may be triggered by predetermined conditions at block 262. As an example, the predetermined conditions may depend on reception quality of the received data and/or a decoding parameter utilized by the first decoding at block 230, such as a list size.

As shown in FIG. 2D, in an embodiment, optionally, UE 111 may estimate at block 263 reception quality of the data received at block 210, and predetermined condition at block 262 may be set as: the reception quality being higher than a threshold. In other words, only if the reception quality is higher than a threshold and first decoding fails, operation at block 250 is performed, namely, bit-flipping a portion of information bits of the output bits. As an example, the reception quality estimated at block 263 may comprise, but is not limited to, one of the following: a signal-to-noise ratio, a signal to interference plus noise ratio, a block error rate, and a bit error rate.

In another embodiment, reception quality estimated at block 263 may also be utilized alternatively or additionally to determine a parameter for the second decoding. In other words, UE 111 may determine a decoding parameter of the second decoding based on an estimation of the reception quality, and use the decoding parameter to perform the second decoding with or without the bit-flipping.

In another embodiment, the predetermined condition at block 262 is related to a decoding parameter utilized in the first decoding. For instance, this predetermined condition may be set as: the list size of first decoding reaching a threshold. That is, in an embodiment, only when the list size utilized in first decoding reaches a threshold and decoding fails, a portion of information bits of the output bits are bit-flipped (250) and the second decoding (260) is performed. If the list size of first decoding does not reach a predetermined threshold, in response to decoding failure, UE 111 may, for example, continue to increase the list size and perform the first decoding (not shown in the figure) again. It should be noted that under this condition, the threshold (or, a limit value) for the list size may be configurable, rather than a theoretical limit value. The maximum theoretical value may be $2^N$, however, to reduce complexity, a value smaller than $2^N$ may be utilized. Considering that a bit-flipped re-decoding may be utilized subsequently, the receiver may use a smaller list size threshold.

As shown in FIG. 2D, optionally, in an embodiment, adjustment of the list size and the bit-flipping may be combined in another manner. For example, the first decoding at block 230 may adopt a polar code decoding algorithm based on a first list size, and method 200 may further comprise in response to decoding failure of the second decoding and decoding times reaching a predetermined threshold (241), at block 264, UE performing a fourth decoding of the pre-processed data with a second list size larger than the first list size. It should be noted that the fourth decoding at block 264 may also be implemented when it is determined at block 271 of FIG. 2C that decoding times reach a threshold.

Optionally or alternatively, in some embodiments, it is also possible to combine classical successive cancellation (SC) decoding and list-based decoding, list-aided decoding and bit-flipping. Besides, corresponding triggering conditions may be designed for this purpose to trigger utilization of a corresponding decoding algorithm.

In some embodiments, if bit-flipping is utilized and the list size is 2, decoding performance (BLER) of CRC-aided list decoding is similar to the case where bit-flipping is not utilized and the list size is 4. In another embodiment, if the list size is 4 and CRC-aided list decoding with the same set of flipping candidates is employed, performance is similar to that of an algorithm where the list size is 8 and bit-flipping is not utilized. Moreover, the method in some embodiments of the present disclosure also brings gain in complexity. Computer simulation results demonstrate that the simulation time of the bit-flipping scheme decreases with the increase of SNR, and the overall simulation time of CRC-aided list decoding with bit-flipping and a list size of 2 is not longer than that of CRC-aided list decoding with the list size of 2.

Figure 3:
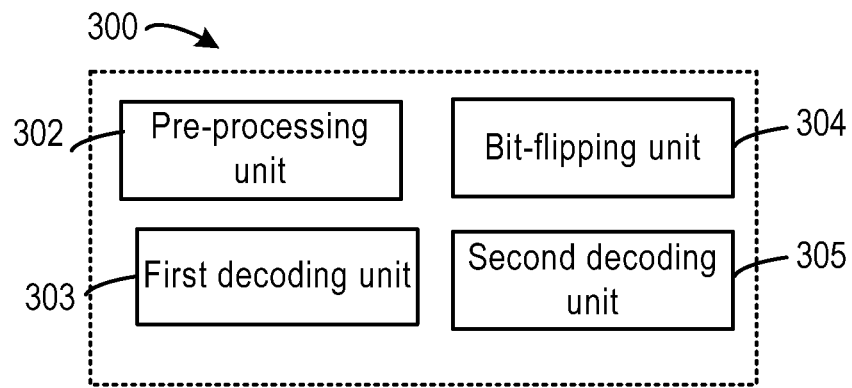
FIG. 3 shows a structural diagram of an apparatus implemented at a receiving device according to an embodiment of the present disclosure.

FIG. 3 shows a block diagram of an apparatus 300 according to some embodiments of the present disclosure. The apparatus 300 may be implemented at a receiver of a communication system (such as the wireless network 100 in FIG. 1), for example, at the terminal device 111 or 112 side or at the network device 101 shown in FIG. 1. Apparatus 300 will be described below with UE 111 as an example.

As shown in FIG. 3, apparatus 300 comprises a pre-processing unit 302 configured to pre-process received data encoded with a polar code to obtain pre-processed data; a first decoding unit 303 configured to perform a first decoding of the pre-processed data to obtain output bits; a bit flipping unit 304 configured to perform bit-flipping of a portion of information bits of the output bits in response to decoding failure of the first decoding, to obtain a first additional frozen bit; and a second decoding unit 305 configured to perform a second decoding based on the first additional frozen bit and the pre-processed data.

In an embodiment, the pre-processing unit 302, the first decoding unit 303, the bit-flipping unit 304 and the second decoding unit 305 may be configured to perform operations of obtaining pre-processing, first decoding, bit-flipping, and second decoding, respectively, according to a method of any embodiment described with reference to methods 200-202 and FIGS. 2A-2D. Therefore, specific details are not repeated here.

In an embodiment, the bit-flipping unit 304 may comprise an estimating unit, a determining unit and a first flipping unit. The estimating unit is configured to estimate reliability of an encoding sub-channel corresponding to an information bit of the output bits. The determining unit is configured to determine a first set of information bits to be flipped based on the estimated reliability of the encoding sub-channels; for example, the determining unit may be configured to determine information bits corresponding to encoding sub-channels with the lowest reliability as the first set of information bits. The first flipping unit is configured to perform bit-flipping of the first set of information bits.

In another embodiment, the determining unit may comprise a set determining unit configured to determine a set of information bits to be flipped based on the estimated reliability of the encoding sub-channels; and a selecting unit configured to select the first set of information bits from the determined set of information bits.

In another embodiment, the apparatus 300 may further comprise a second selecting unit configured to select, from the set of information bits, a second set of information bits different from the first set of information bits in response to decoding failure of the second decoding; a second flipping unit configured to bit-flip the second set of information bits to obtain a second additional frozen bit; and a third decoding unit configured to perform a third decoding based on the second additional frozen bit and the pre-processed data.

In another embodiment, the apparatus may further comprise a checking unit configured to perform cyclic redundancy check CRC of output information bits obtained through the second decoding, to verify correctness of the second decoding. In an embodiment, the checking unit may be configured to verify correctness of the second decoding through at least one of: directly using information bits obtained through the second decoding as the output information bits, and performing CRC of the output information bits; and flipping bit-flipped bits of information bits obtained through second decoding again to obtain the output information bits, and performing CRC of the output information bits.

In another embodiment, apparatus 300 may comprise a reception quality estimation unit corresponding to block 263 shown in FIG. 2D which is configured to estimate reception quality of the data, and where the bit flipping unit 304 may be configured to bit-flip a portion of information bits of the output bits if the reception quality is higher than a threshold and the first decoding fails. The reception quality may comprise, but is not limited to, one of: a signal-to-noise ratio, a signal to interference plus noise ratio, a block error rate, and a bit error rate.

As another example embodiment, apparatus 300 may comprise a parameter determining unit configured to determine a parameter for the second decoding based on the estimated reception quality of the data.

In an embodiment, the first decoding unit is configured to employ a list-based polar code decoding algorithm, and where the bit flipping bit 304 may be configured to bit-flip a portion of information bits of the output bits if the list size utilized by the first decoding reaches a threshold and the decoding fails.

Alternatively, the first decoding unit 303 may be configured to employ a polar code decoding algorithm based on a first list size, and the apparatus may further comprise a fourth decoding unit configured to perform a fourth decoding of the pre-processed data with a second list size larger than the first list size in response to decoding times of the second decoding reaching the predetermined threshold and the second decoding failing.

It should be noted that in some embodiments, apparatus 300 may further comprise other units not shown in the figures. For instance, it may further comprise a receiving unit. Besides, the units contained in apparatus 300 may be implemented in various ways, including software, hardware, firmware or any combination thereof. In an embodiment, one or more units may be implemented with software and/or firmware, for instance, the machine-executable instructions stored on a storage medium. In addition to the machine-executable instructions or as an alternative, a part or all of the units in apparatus 300 may be implemented at least partially by one or more hardware logic components. As an example rather than limitation, the available example hardware logic components include a field programmable gate array (FPGA), an application specific integrated circuit (ASIC), application specific standard parts (ASSP), a system on chip (SOC), and a complex programmable logic device (CPLD) and so on.

Figure 4:
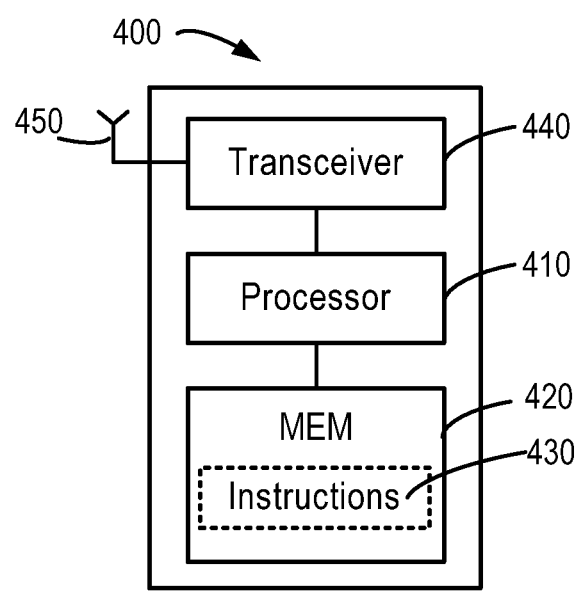
FIG. 4 shows a block diagram of a device according to some embodiments of the present disclosure.

As stated above, in some embodiments, the procedure, method or process described above may be implemented by hardware in a network device or a terminal device. For example, the network device or the terminal device may implement method 300 with its receiver, transceiver and/or processor or controller. FIG. 4 illustrates a block diagram of a device 400 suitable for implementing an embodiment of the present disclosure. Device 400 may be utilized to implement the receiving device or receiver in an embodiment of the present disclosure, such as network device 101 shown in FIG. 1 or a terminal device, for instance, the first terminal device 111 or 112 shown in FIG. 1.

As shown by the example of FIG. 4, device 400 comprises a processor 410 which controls operations and functions of device 400. For example, in some embodiments, the processor 410 may implement various operations by means of instructions 430 stored in a memory 420 coupled thereto. The memory 420 may be any suitable type adapted to local technical environment and may be implemented with any suitable data storage technology, including but not limited to, a semiconductor-based storage device, a magnetic storage device and system, and an optical storage device and system. Though only one memory unit is shown in FIG. 4, a plurality of physically different memory units may exist in device 400.

The processor 410 may be any proper type adapted to local technical environment, and may comprise, but is not limited to, one or more of a general computer, a customized computer, a micro-controller, a digital signal controller (DSP) and a controller based multi-core processor architecture. The device 400 may also comprise a plurality of processors 410. The processors 410 may also be coupled with a transceiver 440 which enables reception and transmission of information by means of one or more antennae 450 and/or other components. For example, the processor 410 and the memory 420 can operate in cooperation to implement method 200, 201 and/or 202 described with reference to FIGS. 2A-2D. It shall be appreciated that all the features described above with reference to FIGS. 2A-2D also apply to device 400, and therefore will not be detailed here.

Generally, various exemplary embodiments of the present disclosure may be implemented in hardware or application-specific circuit, software, logic, or any combination thereof. Some aspects may be implemented in hardware, while the other aspects may be implemented in firmware or software executed by a controller, a microprocessor or other computing device(s). When various aspects of the embodiments of the present disclosure are illustrated or depicted as block diagrams, flow charts, or other graphical representations, it should be understood that the block diagrams, apparatus, system, technique or method described here may be implemented, as non-restrictive examples, in hardware, software, firmware, dedicated circuit or logic, common hardware or controller or other computing devices, or some combination thereof.

As an example, embodiments of the present disclosure may be described in a context of machine-executable instructions which are included, for instance, in the program module executed in the device on a target real or virtual processor. Generally, a program module includes routine, program, library, object, class, component and data structure, etc. and performs a particular task or implements a particular abstract data structure. In various embodiments, functions of program modules may be combined or divided among the program modules. The machine executable instructions for a program module may be executed locally or in a distributed device. In the distributed device, the program module may be located in both the local and remote storage mediums.

The computer program codes for implementing a method of the present disclosure may be complied with one or more programming languages. These computer program codes may be provided to a general-purpose computer, a customized computer or a processor of other programmable data processing apparatuses, such that when the program codes are executed by the computer or other programmable data processing apparatuses, the functions/operations prescribed in the flow chart and/or block diagram are caused to be implemented. The program codes may be executed completely on a computer, partially on a computer, partially on a computer as an independent software packet and partially on a remote computer, or completely on a remote computer or server.

In the context of the present disclosure, the machine-readable medium may be any tangible medium including or storing a program for or about an instruction executing system, apparatus or device. The machine-readable medium may be a machine-readable signal medium or machine-readable storage medium. The machine-readable medium may include, but not limited to, electronic, magnetic, optical, electro-magnetic, infrared, or semiconductor system, apparatus or device, or any appropriate combination thereof. More detailed examples of the machine-readable storage medium include, an electrical connection with one or more wires, a portable computer magnetic disk, hard drive, random-access memory (RAM), read-only memory (ROM), erasable programmable read-only memory (EPROM or flash memory), optical storage device, magnetic storage device, or any appropriate combination thereof.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of the subject matter described herein, but rather as descriptions of specific embodiments. Certain features that are described in this specification in the context of separate embodiments can also be implemented in combination in a single embodiment. Conversely, various features that are described in the context of a single embodiment can also be implemented in multiple embodiments separately or in any suitable sub-combination.

Although the subject matter has been described in language specific to structural features and/or method actions, it is to be understood that the subject matter specified in the appended claims is not limited to the specific features or actions described above. Rather, the specific features and actions described above are disclosed as example forms for implementing the claims.

I claim:

1. A method of data processing in a communication system, comprising:
    pre-processing received data encoded with a polar code, thereby producing pre-processed data;
    performing a first polar decoding of the pre-processed data to obtain output bits;
    in response to decoding failure of the first decoding, bit-flipping a portion of information bits of the output bits to obtain a first additional frozen bit;
    performing a second polar decoding based on the first additional frozen bit and the pre-processed data; and
    performing a cyclic redundancy check of output information bits obtained through the second decoding, to verify correctness of the second polar decoding;
    wherein performing the cyclic redundancy check of output information bits obtained through the second polar decoding comprises flipping again bit-flipped bits of information bits obtained through second polar decoding to obtain the output information bits, and performing the cyclic redundancy check of the output information bits.

2. The method according to claim 1, wherein bit-flipping a portion of information bits of the output bits comprises:
    estimating reliability of an encoding sub-channel corresponding to an information bit of the output bits;
    determining a first set of information bits to be flipped based on the estimated reliability of the encoding sub-channel; and
    bit-flipping the first set of information bits.

3. The method according to claim 2, wherein determining a first set of information bits to be flipped comprises:
    determining information bits corresponding to encoding sub-channels with the lowest reliability as the first set of information bits.

4. The method according to claim 2, wherein determining a first set of information bits to be flipped comprises:
    based on the estimated reliability of the encoding sub-channels, determining a set of information bits to be flipped; and
    selecting the first set of information bits from the determined set of information bits.

5. The method according to claim 4, further comprising:
    in response to decoding failure of the second decoding, selecting, from the set of information bits, a second set of information bits different from the first set of information bits;
    bit-flipping the second set of information bits to obtain a second additional frozen bit; and
    performing a third polar decoding based on the second additional frozen bit and the pre-processed data.

6. The method according to claim 1, further comprises:
estimating reception quality of the received data,
wherein bit-flipping a portion of information bits of the output bits comprises:
bit-flipping a portion of the information bits of the output bits, if the reception quality is higher than a threshold and the first decoding fails.

7. The method according to claim 6, wherein the reception quality comprises one of:
a signal-to-noise ratio,
a signal to interference plus noise ratio,
a block error rate, and
a bit error rate.

8. The method according to claim 6, further comprising:
determining a parameter for the second polar decoding, based on the estimated reception quality of the data.

9. The method according to claim 1, wherein the first decoding employs a list-based polar code decoding algorithm, and
wherein bit-flipping a portion of information bits of the output bits comprises:
bit-flipping a portion of the information bits of the output bits, if a list size employed in the first polar decoding reaches a threshold and the first polar decoding fails.

10. The method according to claim 1, wherein the bit-flipping and the second polar decoding are performed for a plurality of rounds until decoding times reach a predetermined threshold or the second polar decoding succeeds, comprising in each round:
performing the bit-flipping for a different set of bits to obtain different additional frozen bits; and
performing the second polar decoding using the different additional frozen bits and the pre-processed data.

11. The method according to claim 10, wherein the first polar decoding employs a polar code decoding algorithm based on a first list size, and
the method further comprises:
in response to decoding times of the second polar decoding reaching the predetermined threshold and decoding failure of the second polar decoding, using a second list size larger than the first list size to perform a fourth polar decoding to the pre-processed data.

12. A communication device, comprising:
at least one processor; and
at least one memory storing instructions, which when executed by the at least one processor, cause the communication device to perform the method according to claim 1.

13. A non-transitory computer readable medium having a computer program stored thereon which, when executed by at least one processor, causes the at least one processor to perform the method according to claim 1.

* * * * *